(12) United States Patent  
Sakai

(10) Patent No.: US 8,994,445 B2  
(45) Date of Patent: Mar. 31, 2015

(54) ELECTRONIC DEVICE

(71) Applicant: Seiko Epson Corporation, Tokyo (JP)

(72) Inventor: Takayuki Sakai, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 12 days.

(21) Appl. No.: 13/827,348

(22) Filed: Mar. 14, 2013

(65) Prior Publication Data

US 2013/0271206 A1   Oct. 17, 2013

(30) Foreign Application Priority Data

Apr. 16, 2012   (JP) ................................. 2012-092678

(51) Int. Cl.
```
G05F 1/00     (2006.01)
H03L 5/00     (2006.01)
G06F 1/30     (2006.01)
G06F 1/26     (2006.01)
```
(52) U.S. Cl.
CPC .. H03L 5/00 (2013.01); G06F 1/30 (2013.01); G06F 1/266 (2013.01)
USPC .......................................... 327/518; 710/305

(58) Field of Classification Search
USPC .......... 327/518; 385/1.15; 710/302, 305, 310, 710/313; 713/310
See application file for complete search history.

(56) References Cited

U.S. PATENT DOCUMENTS 6,806,978 B1 * 10/2004 Tamura et al. ............... 358/1.15  
2010/0199112 A1   8/2010 Yokota et al.

FOREIGN PATENT DOCUMENTS

JP   2001-095016 A   4/2001  
JP   2010-176536 A   8/2010  
JP   2011-046097 A   3/2011

* cited by examiner

*Primary Examiner* — Diana J Cheng  
(74) *Attorney, Agent, or Firm* — Nutter McClennen & Fish LLP; John J. Penny, Jr.; Joshua I. Rudawitz

(57) ABSTRACT

A CPU outputs a high level ENB signal to a USB-IC via an ENB line and monitors, after outputting the ENB signal, whether or not there is an overcurrent in the USB-IC on the basis of the voltage level of the ENB line. The USB-IC outputs, when it receives the ENB signal, a 5 V voltage to a VBUS line and stops, when an overcurrent occurs, output of the 5 V voltage to the VBUS line. A connector changes the voltage level of the ENB line to a high voltage level using the 5 V voltage of the VBUS line and changes, when output of the 5 V voltage is stopped, the voltage level of the ENB line to a low level. Thus, the ENB line may be shared for outputting the ENB signal from the CPU and for providing notification of an overcurrent from the USB-IC.

4 Claims, 3 Drawing Sheets

ELECTRONIC DEVICE

CROSS REFERENCES TO RELATED APPLICATIONS

The entire disclosure of Japanese Patent Application No. 2012-092678, filed on Apr. 16, 2012, is expressly incorporated by reference herein.

BACKGROUND

1. Technical Field

The present disclosure relates to an electronic device.

2. Related Art

In the related art, as this type of electronic device, a device is proposed which includes a plurality of control units such as a CPU that controls the entire device and a USB controller that controls communication with a USB device connected to a USB port (see, for example, JPA-2010-176536). In this device, the CPU and the USB controller are connected with each other via a bus and a bridge device, etc.

As described in JP-A-2011-46097, the USB controller of the above-described electronic device is connected to a USB device via the USB port using power source system lines including a VBUS line and a ground line, and data communication system lines including a D+ line and a D− line. The USB controller supplies necessary power to the USB device and exchanges data with the USB device through the above-described plurality of lines.

There are cases where the above-described power source system lines and data communication system lines are used in connecting the CPU and the USB controller with each other in the electronic device. Moreover, a line through which a signal instructing driving from the CPU to the USB controller is sent and a line through which a signal providing notification of a defect such as an overcurrent flowing from the USB to the CPU is sent, etc. might be further used. Thus, as the number of lines connected between control units increases, the space used for wiring increases. However, since the size of such electronic devices is being increasingly reduced, there might be cases where the sufficient space is not ensured.

SUMMARY

Some aspects of the present disclosure are advantageous in that the number of lines used for connecting control units in an electronic device is reduced.

The present disclosure has the following aspects.

A first electronic device according to an aspect of the present disclosure is an electronic device including a main control unit, and a sub-control unit that is connected to the main control unit via a connection circuit including a predetermined signal line and that performs control of an external device, the main control unit outputs as an enable signal that enables driving of the sub-control unit a signal which represents a high voltage level to the sub-control unit via the predetermined signal line and detects, after output of the enable signal is completed, a defect in the sub-control unit on the basis of whether or not the voltage level of the predetermined signal line is the high voltage level, the sub-control unit outputs, when the enable signal is inputted thereto from the main control unit, a predetermined voltage to a power line that is capable of supplying power to the external device and stops, when a defect related to power supply occurs, output of the predetermined voltage to the power line, and the connection circuit is configured so that, when the predetermined voltage is outputted to the power line, the voltage level of the predetermined signal line is changed to the high voltage level by the predetermined voltage and, when output of the predetermined voltage to the power line is stopped, the voltage level of the predetermined signal line is changed to the low level.

In the first electronic device according to the aspect of the present disclosure, the main control unit outputs as an enable signal that enables driving of the sub-control unit a signal which represents a high voltage level to the sub-control unit via the predetermined signal line and detects, after output of the enable signal is completed, a defect in the sub-control unit on the basis of whether or not the voltage level of the predetermined signal line is the high voltage level. Also, the sub-control unit outputs, when the enable signal is inputted thereto from the main control unit, a predetermined voltage to a power line that is capable of supplying power to the external device and stops, when a defect related to power supply occurs, output of the predetermined voltage to the power line. Moreover, the connection circuit including the predetermined signal line is configured so that, when the predetermined voltage is outputted to the power line, the voltage level of the predetermined signal line is changed to the high voltage level by the predetermined voltage and, when output of the predetermined voltage to the power line is stopped, the voltage level of the predetermined signal line is changed to the low level. Thus, the predetermined signal line may be shared for outputting an enable signal from the main control unit and for providing notification of a defect related to power supply from the sub-control unit. As a result, the number of lines used for connection between control units may be reduced. Note that, a defect related to power supply may be, for example, a defect of an overcurrent or the like.

In the first electronic device according to the aspect of the present disclosure, the connection circuit may be connected to the power line and is grounded via a first resistor and a second resistor, and further includes a first line connected to the predetermined signal line at a point between the first resistor and the second resistor. Thus, the voltage level of the predetermined signal line may be made to correspond to the voltage level of the enable signal using a simple configuration. Therefore, even when the predetermined signal line is shared, an overcurrent in the sub-control unit may be more reliably detected.

In the first electronic device according to the aspect of the present disclosure, the connection circuit may further include a second line connected to the predetermined signal line at a point closer to the main control unit than a connection point of the predetermined signal line and the first line, and the main control unit may include an enable signal terminal connected to the predetermined signal line, and a monitor terminal connected to the second line, and the main control unit may be configured to change, when the enable signal is outputted, the voltage level of the enable signal terminal to the high voltage level, determine, when the enable signal has continued to be in a high voltage level state for a predetermined time, that output of the enable signal is completed, put the enable signal terminal into a high-impedance state, start monitoring the voltage level that is to be inputted to the monitor terminal, and thereby detect a defect in the sub-control unit. "The predetermined time" used herein may be, for example, a time from the time when the enable signal terminal is changed to the high voltage level to the time when the predetermined voltage is outputted to the power line from the sub-control unit and the voltage level of the predetermined signal line is stabilized at the high voltage level, or the like. Thus, when the enable signal terminal is put into a high-impedance state, the predetermined level is already stabled, and therefore, error detection of a defect in the sub-control unit may be prevented.

A second electronic device according to another aspect of the present disclosure is an electronic device including a main control unit, and a sub-control unit that is connected to the main control unit via a predetermined signal line provided with a resistor and performs control of an external device, the main control unit outputs as an enable signal that enables driving of the sub-control unit a signal which represents a high voltage level or a low voltage level to the sub-control unit via the predetermined signal line and detects a defect in the sub-control unit on the basis of whether or not the voltage level at a point on the predetermined signal line which is located closer to the sub-control unit than the resistor is the level of the enable signal or an inverse of the level of the enable signal while the main control unit outputs the signal, and the sub-control unit outputs, when the enable signal is inputted thereto from the main control unit, a predetermined voltage to a power line that is capable of supplying power to the external device and inverts, when a defect related to power supply occurs, the voltage level at the point on the predetermined signal line which is located closer to the sub-control unit than the resistor from the level of the enable signal.

In the second electronic device according to the aspect of the present disclosure, the main control unit outputs as an enable signal that enables driving of the sub-control unit a signal which represents a high voltage level or a low voltage level to the sub-control unit via the predetermined signal line provided with the resistor and detects a defect in the sub-control unit on the basis of whether or not the voltage level at a point on the predetermined signal line which is located closer to the sub-control unit than the resistor is the level of the enable signal or an inverse of the level of the enable signal while the main control unit outputs the signal. Also, the sub-control unit outputs, when the enable signal is inputted thereto from the main control unit, a predetermined voltage to a power line that is capable of supplying power to the external device and inverts, when a defect related to power supply occurs, the voltage level at the point on the predetermined signal line which is located closer to the sub-control unit than the resistor from the level of the enable signal. Thus, the predetermined signal line may be shared for outputting an enable signal from the main control unit and for providing notification of a defect related to power supply from the sub-control unit. As a result, the number of lines used for connection between control units may be reduced.

In the second electronic device according to the aspect of the present disclosure may further include a connection circuit including the predetermined signal line, a third line connected to the predetermined signal line at a point located closer to the sub-control unit than the resistor, and a forth line connected to the predetermined signal line at a point located closer to the sub-control unit than the resistor and closer to the main control unit than a connection point of the third line, the sub-control unit may be connected to the third line, in addition to the predetermined signal line, and be configured to invert, when a defect occurs, the voltage level of the predetermined signal line from the level of the enable signal by inverting the voltage level of the third line, and the main control unit may be connected to the fourth line, in addition to the predetermined signal line, and be configured to detect a defect in the sub-control unit on the basis of whether or not the voltage level of the fourth line is the level of the enable signal or the inverse of the level of the enable signal. Thus, the configuration and processing of the connection circuit for sharing the predetermined signal line may be simplified.

In the first and second electronic devices according to the above-described aspects of the present disclosure, the main control unit and the sub-control unit may be separately arranged on different substrates. In such an electronic device, a line that connects control units is provided between substrates, and thus, advantageously, the number of lines may be further reduced. Thus, it is of great significance to apply the aspects of the present disclosure.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

Figure 1:
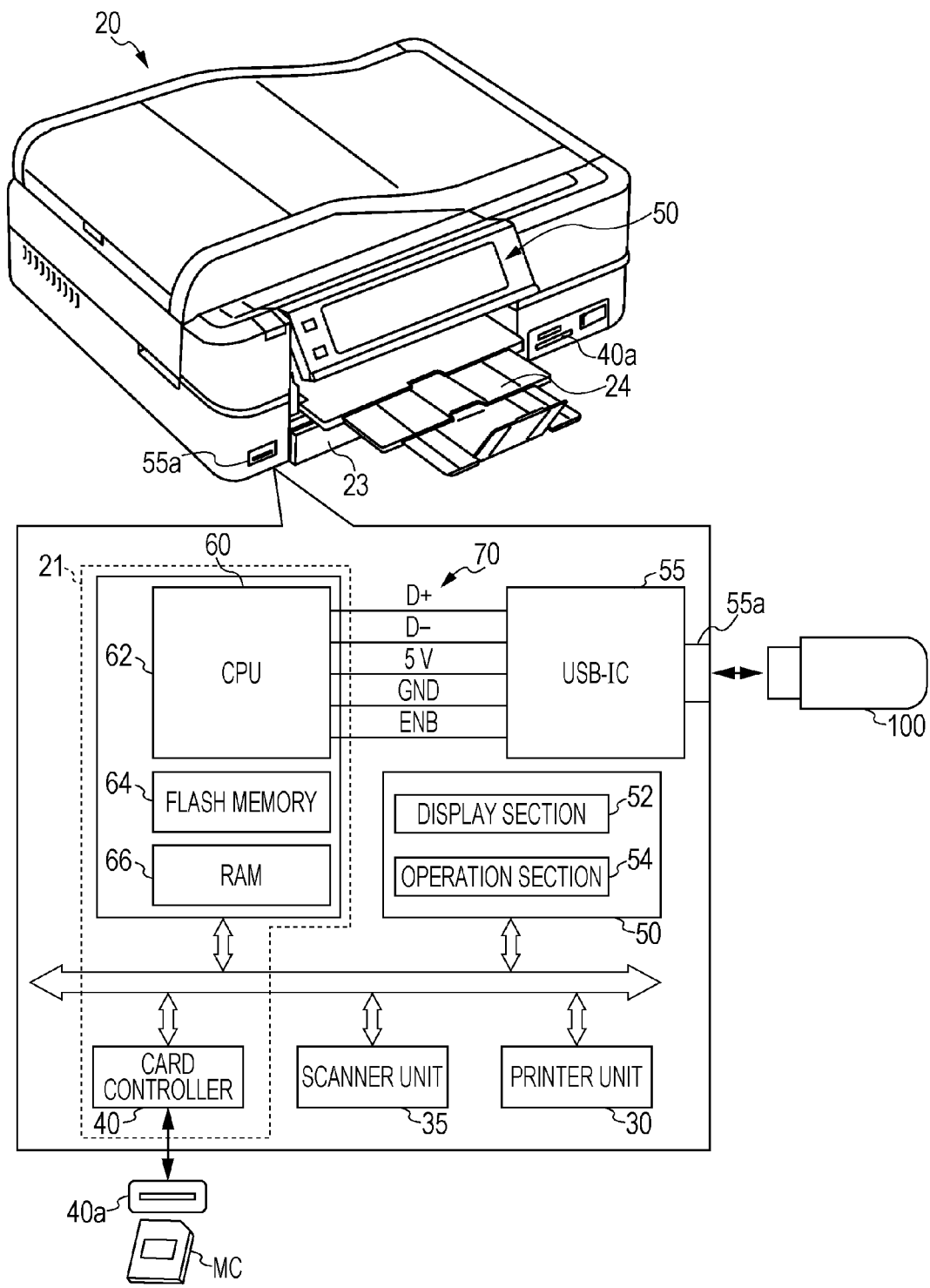
FIG. 1 is a configuration diagram schematically illustrating a configuration of a printer according to a first embodiment.

A first embodiment of the present disclosure will be hereinafter described with reference to the drawings. FIG. 1 is a configuration diagram schematically illustrating a configuration of a printer 20 according to the first embodiment of the present disclosure. As illustrated in FIG. 1, the printer 20 includes an ink-jet type printer unit 30, a flat-head type scanner unit 35, a card controller 40, a touch-panel type operation panel 50, a USB-IC 55, and a main controller 60 configured as a microprocessor centered around a CPU 62, which are electrically connected with one another. The printer unit 30 executes printing by ejecting an ink of each color from a print head to a paper transported from a paper feed tray 23 on the basis of print data and ejects the paper to a catch tray 24. The scanner unit 35 decomposes reflected light of light which has been emitted to a document placed on a glass base (not illustrated) into each color to make the reflected light into image data. The card controller 40 reads and writes data from and to a memory card MC inserted in a card slot 40a. The operation panel 50 includes a display section 52 that displays various setting screens and the like and an operation section 54 that accepts a touch panel operation and a power button operation, etc. Note that, in the first embodiment, the card controller 40 and the main controller 60 are integrated on a single substrate so as to be configured as a system on chip (SOC) 21 and the USB-IC 55 is provided on a different substrate from the substrate of the SOC 21.

The USB-IC 55 reads and writes data from and to an external device 100 (a USB device such as a USB flash memory and a CD and DVD drive, etc.) and controls power supply to the external device 100. The USB-IC 55 is connected to the CPU 62 of the main controller 60 via the connector 70. The connector 70 includes five lines in total, i.e., a 5 V line and a ground (GND) line that serve as power source system lines, a D+ line and a D− line that serve as data (signal) transmission system lines, and an ENB line. Note that the ENB line is used for transmitting an ENB signal (an enable signal) that enables driving (start-up) of the USB-IC 55, details of which will be described later. Although not illustrated in FIG. 1, the USB-IC 55 is connected to the external device 100 via a USB port 55a by four lines in total, i.e., the VBUS line and the ground line that serve as the power source system lines, the D+ line and the D− line that serve as the data (signal) transmission system lines. The USB-IC 55 is configured so as to stop power supply to the power source system line when an overcurrent occurs due to insertion of a foreign object into the USB port 55a and the like.

The main controller 60 includes, in addition to the CPU 62, a flash memory 64 that stores various processing programs, various types of data, and various tables, etc., and a RAM 66 that temporarily stores various types of data. The main controller 60 outputs various processing commands or various operation commands to the printer unit 30, the scanner unit 35, the card controller 40, the operation panel 50, and the USB-IC 55. The main controller 60 also receives various types of data via the card controller 40 and the USB-IC 55, and receives operation commands accepted via the operation panel 50. Note that exchange of the various commands and the various types of data with the USB-IC 55 is performed via each of the lines of the connector 70.

Figure 2:
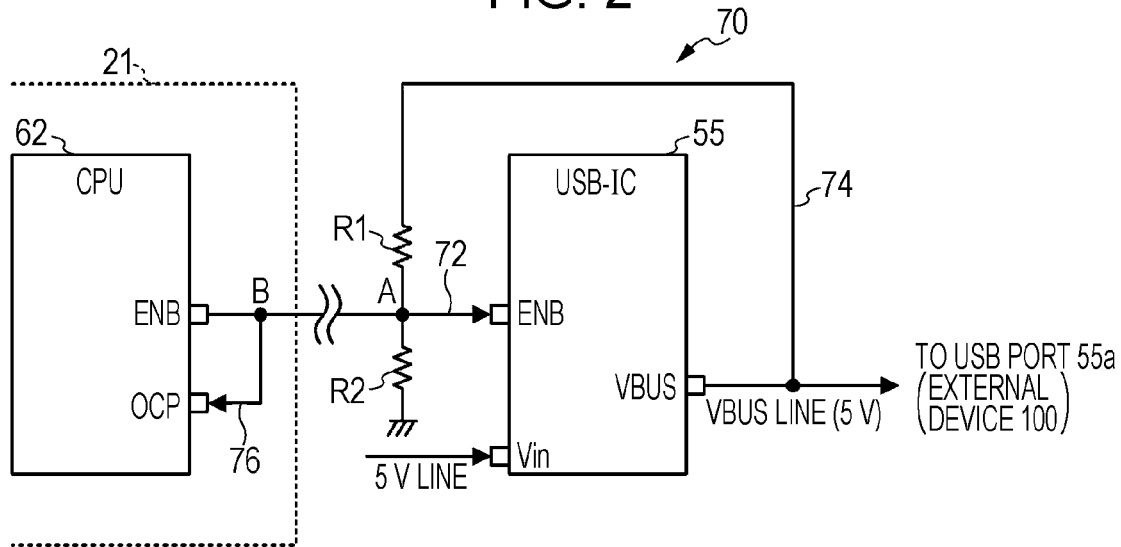
FIG. 2 is a circuit diagram illustrating a circuit configuration of a connector according to the first embodiment.

FIG. 2 is a circuit diagram illustrating a circuit configuration of the connector 70. Note that, in the connector 70 of FIG. 2, the ENB line 72 and the 5 V line among the five lines of FIG. 1 are illustrated. As illustrated in FIG. 2, the ENB line 72 is connected to an ENB terminal of the CPU 62 and an ENB terminal of the USB-IC 55. Note that, when the CPU 62 outputs the ENB signal, the CPU 62 changes the voltage level of the ENB terminal to a high voltage level (for example, 3.3 V) and, when the CPU 62 does not output the ENB signal, the CPU 62 puts the ENB terminal into a high impedance (Hi-Z) state. The 5 V line is connected to a Vout terminal (not illustrated) of the CPU 62 and a Vin terminal (not illustrated) of the USB-IC 55. Note that, when a high level ENB signal is inputted to the ENB terminal, the USB-IC 55 starts output (application) of a 5 V power source from the VBUS line connected to a VBUS terminal to the USB port 55a (the external device 100) using the 5 V power source inputted to the Vin terminal from the 5 V line. The connector 70 includes a pull-up line 74 connected to the VBUS line, grounded via resistors R1 and R2, and connected to the ENB line 72 at a connection point A of the resistors R1 and R2, and a monitor line 76 connected to the ENB line 72 at a connection point B located closer to the CPU 62 than the connection point A of the ENB line 72 and connected to an overcurrent protection (OCP) terminal. The pull-up line 74 is a line used for pulling up, when the 5 V power source is outputted (i.e., a 5 V voltage is applied as the VBUS voltage) to the VBUS line, the voltage of the ENB line 72 to a voltage in accordance with the division ratio between the resistors R1 and R2. Note that respective resistance values or (the resistance between) the resistors R1 and R2 are set such that a potential at the point A which is to be pulled up is 3-4 V (for example, the same voltage level as that of the ENB signal, i.e., 3.3 V).

Figure 3:
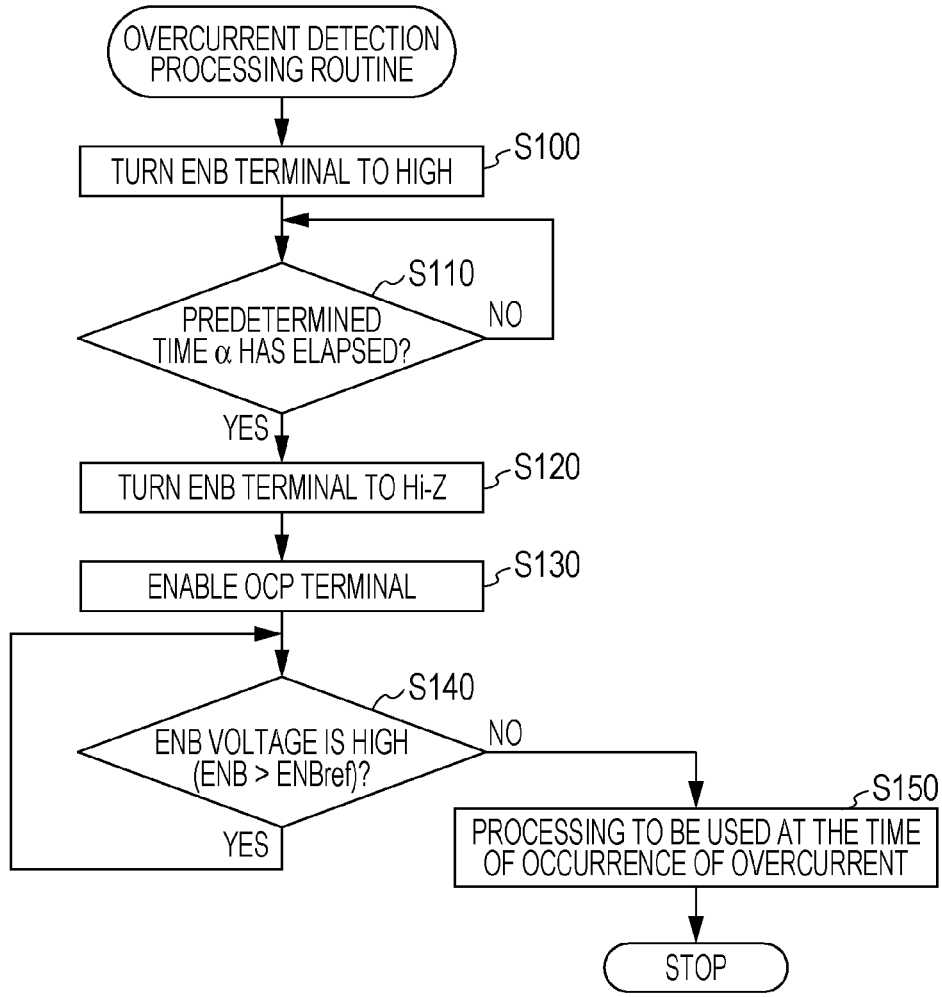
FIG. 3 is a flowchart illustrating an example of overcurrent detection processing routine.
Figure 4:
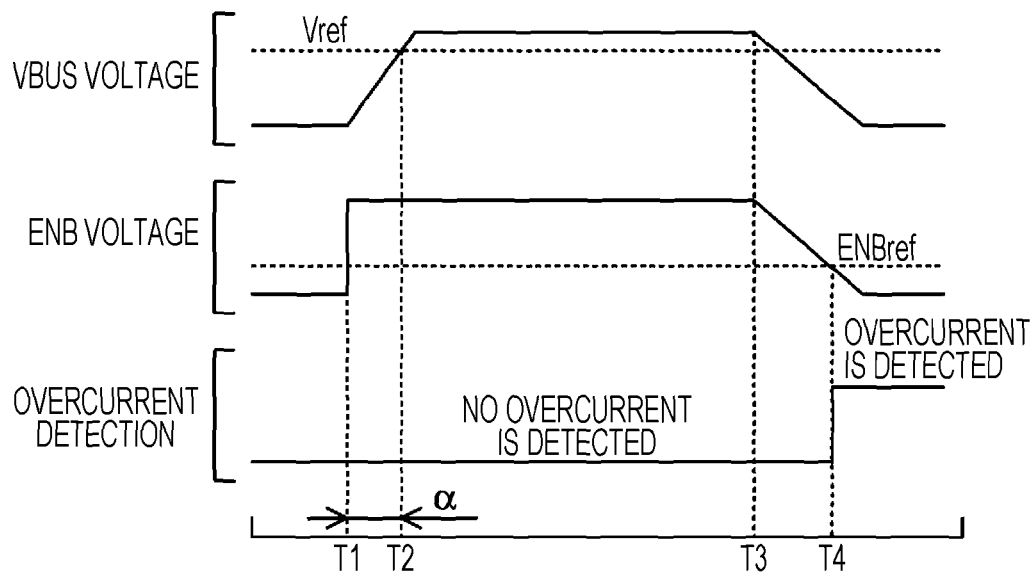
FIG. 4 is a diagram illustrating how a VBUS voltage, an ENB voltage, and overcurrent detection change with time.

Next, the operation of the printer 20 of the first embodiment having the above-described configuration, and in particular, processing that causes the main controller 60 to detect an overcurrent generated in the USB-IC 55 (the USB port 55a) will be described hereinafter. FIG. 3 is a flowchart illustrating an example of an overcurrent detection processing routine executed by the main controller 60. This routine is executed by the main controller 60 in initialization processing performed when the power of the printer 20 is turned on, and the like, to enable driving (start-up) of the USB-IC 55 as well as to detect an overcurrent. FIG. 4 is a diagram illustrating how the VBUS voltage, an ENB voltage, and overcurrent detection change with time while this routine is performed, which will be described along with the description of the routine.

When this routine is executed, the CPU 62 of the main controller 60 first changes the ENB terminal (the ENB voltage) to the high voltage level (High), i.e., for example, 3.3 V (Step S100, see, for example, Time T1 in FIG. 4) and waits for a predetermined time α to elapse (Step S110). When the ENB terminal is changed to the high voltage level, a high level ENB signal is inputted to the ENB terminal of the USB-IC 55 via the ENB line 72. Therefore, as described above, the USB-IC 55 starts output of the 5 V power source from the VBUS terminal, and thus, as illustrated in FIG. 4, the VBUS voltage gradually increases. The above-described predetermined time α is obtained in advance from an experiment or the like and is defined as a time that is sufficient for the VBUS voltage to increase to a predetermined voltage Vref (for example, 4.5 V corresponding to 90% of the 5 V power source). Specifically, the predetermined time α may be several ms or several tens of ms, and is 7 ms in the first embodiment.

When it is determined that the predetermined time α has elapsed in Step S110, the ENB terminal is put into a high-impedance (Hi-Z) state (Step S120) and an OCP terminal is enabled (Step S130). Within the predetermined time α, the voltage of the VBUS line has increased to around 5 V, and the ENB line 72 has been pulled up by the pull-up line 74 branching from the VBUS line. Therefore, when the ENB terminal is put into a high-impedance state after a lapse of the predetermined time α, the pulled-up voltage level of the ENB line 72 may be caused to be stabilized at the high voltage level. Thus, a high level voltage is inputted (applied) as the ENB voltage to the OCP terminal.

When the OCP terminal is enabled, whether or not the ENB voltage to be inputted to the OCP terminal represents the high voltage level (High) (whether or not the ENB voltage is higher than the predetermined threshold ENBref) is determined (Step S140), and whether or not there is an overcurrent is monitored. Note that the predetermined threshold ENBref may be set to be, for example, a value near 1 V as a voltage with which determination of whether or not there is an overcurrent may be performed without causing an error in determination, even when a voltage to be pulled up is changed by fluctuation of the VBUS voltage. In the first embodiment, the predetermined ENBref is 0.8 V. If the voltage to be applied to the OCP terminal represents the high voltage level, it is determined that an overcurrent has not occurred, and the monitoring of Step S140 is repeated.

As described above, in the first embodiment, the USB-IC 55 is configured to stop, when an overcurrent occurs, power supply to the power source system line, and therefore, when an overcurrent occurs, output of the 5 V power source is stopped, the VBUS voltage gradually decreases, and accordingly, the ENB voltage gradually decreases (see, for example, Time T3 in FIG. 4) to the low level. At this time, the ENB voltage pulled up by the ENB line 72 also gradually decreases and, when the ENB voltage becomes lower than the predetermined threshold ENBref (see, for example, Time T4 in FIG. 4), it is determined that the ENB voltage to be inputted to the OCP terminal does not represent the high level voltage in Step S140. Thus, it is determined that an overcurrent has occurred, processing to be used at the time of the occurrence of an overcurrent is executed (Step S150), and then, this routine is terminated. As the processing to be used at the time of the occurrence of an overcurrent, for example, processing in which an error message is outputted to the display section 52 of the operation panel 50 to notify a user of an error is executed. Thus, even when a signal line used specifically for transmitting a signal providing notification that an overcurrent has occurred from the USB-IC 55 to the CPU 62 is not provided between the substrates, the CPU 62 may detect the occurrence of an overcurrent by monitoring the ENB voltage of the ENB line 72. This is a reason why the connector 70 is configured so that the pull-up line 74 branches out from the VBUS line so as to pull up the ENB voltage of the ENB line 72. Note that, if the power button of the printer 20 is turned off while monitoring of the Step S140 is repeated, this routine is consequently terminated.

The correspondence relationship between constituent elements of the first embodiment and constituent elements of aspects of the present disclosure will be hereinafter clarified. The CPU 62 of the main controller 60 according to the first embodiment corresponds to "the main control unit," the USB-IC 55 corresponds to "the sub-control unit," and the connector 70 corresponds to "the connection circuit." Also, the ENB line 72 corresponds to "the predetermined signal line," the pull-up line 74 corresponds to "the first line," the monitor line 76 corresponds to "the second line," the ENB terminal of the CPU 62 corresponds to "the enable signal terminal," and the OCP terminal of the CPU 62 corresponds to "the monitor terminal."

According to the first embodiment, in the printer 20 described above, the CPU 62 outputs the high level ENB signal to the USB-IC 55 via the ENB line 72 and detects, after output of the ENB signal is completed, an overcurrent in the USB-IC 55 on the basis of whether or not the voltage level of the ENB line 72 is the high voltage level. Also, the USB-IC 55 outputs, when the ENB signal is inputted to the USB-IC 55 from the CPU 62, the 5 V voltage to the VBUS line, and stops, when an overcurrent occurs in the USB port 55a, output of the 5 V voltage to the VBUS line. Then, the connector 70 that connects the CPU 62 and the USB-IC 55 changes, when the 5 V voltage is outputted to the VBUS line, the voltage level of the ENB line 72 to the high voltage level using the 5 V voltage and changes, when output of the 5 V voltage to the VBUS line is stopped, the voltage level of the ENB line 72 to a level different from the high voltage level. Thus, the ENB line 72 may be shared for outputting the ENB signal from the CPU 62 and for providing notification of an overcurrent from the USB-IC 55. As a result, the number of lines used for connecting the CPU 62 and the USB-IC 55 to each other may be reduced.

The pull-up line 74 is connected to the ENB line 72 at the connection point A of the resistors R1 and R2, and thus, the voltage level of the ENB line 72 which is to be pulled up may be made to correspond to the voltage level of the ENB signal using a simple configuration. Therefore, even when the ENB line 72 is shared, an overcurrent in the USB-IC 55 may be more reliably detected. Furthermore, the CPU 62 determines, if the ENB terminal continues to represent the high voltage level for the predetermined time α, that output of the ENB signal is completed, and starts monitoring the voltage level to be applied to the OCP terminal while it puts the ENB terminal into a high-impedance state. Thus, error detection of an overcurrent in the USB-IC 55 may be prevented. The CPU 62 and the USB-IC 55 are separately provided on different substrates, and thus, advantageously, the number of lines may be further reduced.

Second Embodiment

Figure 5:
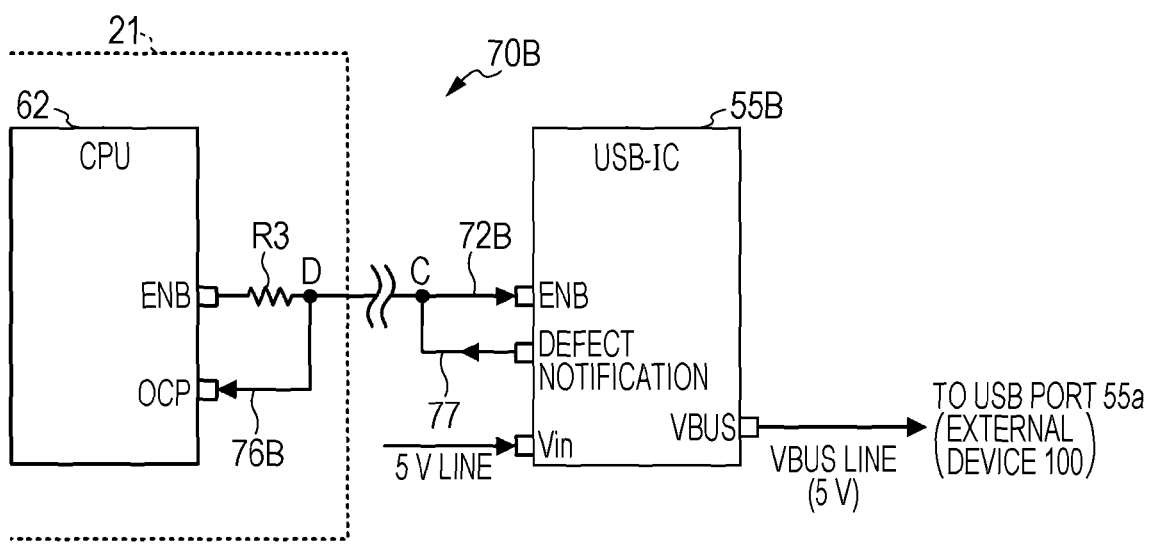
FIG. 5 is a circuit diagram illustrating a circuit configuration of a connector according to a second embodiment.

Next, a second embodiment of the present disclosure will be described. A printer 20B according to the second embodiment of the present disclosure has the same configuration as that of the printer 20 of the first embodiment, except that the specification of a USB-IC 55B and the circuit configuration of a connector 70B are different from the specification of the USB-IC 55 and the circuit configuration of the connector 70. Thus, constituents of the printer 20B of the second embodiment which are identical to those of the printer 20 of the first embodiment are denoted by the same reference characters, and the description thereof will be omitted. FIG. 5 is a circuit diagram of the connector 70B according to the second embodiment.

Similar to the USB-IC 55, the USB-IC 55B reads and writes data from and to the external device 100 connected to the USB port 55a and controls power supply to the external device 100. Also, USB-IC 55B is connected to the CPU 62 of the main controller 60 via the connector 70B. The USB-IC 55B is configured so as to not only stop power supply to the power source system line but also transmit a defect notification signal via the connector 70B when an overcurrent occurs due to insertion of a foreign object to the USB port 55a or the like. The specification of the USB-IC 55B is different from that of the USB-IC 55 in that the USB-IC 55B includes a defect notification terminal. Also, although not illustrated, the USB-IC 55B is configured so as to selectively determine whether the defect notification terminal is grounded or is ungrounded to be open. Thus, the high level voltage to be inputted (applied) to the defect notification terminal may be inverted to the low level, and a signal having the inverse is outputted as a defective notification signal.

Similar to the connector 70, the connector 70B includes five lines in total, i.e., a 5 V line and a ground (GND) line that serve as power source system lines, a D+ line and a D– line that serve as data (signal) transmission system lines, and an ENB line. In FIG. 5, an ENB line 72B and the 5 V line among the five lines are illustrated. As illustrated in FIG. 5, the ENB line 72B is connected to the ENB terminal of the CPU 62 and the ENB terminal of the USB-IC 55B and includes a resistor R3 in the vicinity of the ENB terminal of the CPU 62. Note that, also in the second embodiment, similar to the first embodiment, a high level signal is used as the ENB signal. The connector 70B includes a monitor line 76B connected to the ENB line 72B and the OCP terminal of the CPU 62, and a defect notification line 77 connected to the ENB line 72B and the defect notification terminal of the USB-IC 55B. The defect notification line 77 is connected to the ENB line 72B at a connection point C (on the substrate on which the USB-IC 55B is arranged) located closer to the USB-IC 55B than the resistor R3. The monitor line 76B is connected to the ENB line 72B at a connection point D (on the SOC 21 on which the main controller 60 is arranged) located closer to the CPU 62 than the connection point C and closer to the USB-IC 55B than the resistor R3.

Next, the operation of the printer 20B of the second embodiment having the above-described configuration, and in particular, processing that causes the main controller 60 to detect an overcurrent generated in the USB-IC 55B (the USB port 55a) will be described. An overcurrent detection processing routine executed by the main controller 60 of the second embodiment and the overcurrent detection processing routine of the first embodiment share process steps in common, except a part. Therefore, the illustration of the shared process steps will be omitted, and the same process steps as those of the overcurrent detection processing routine of FIG. 3 are denoted by the same reference characters, the descriptions of which will be given below.

When the overcurrent detection processing routine of the second embodiment is executed, the CPU 62 of the main controller 60 first changes the ENB terminal (the ENB voltage) to the high voltage level (High), i.e., for example, 3.3 V (Step S100), and the OCP terminal is enabled (Step S130). The CPU 62 of the second embodiment changes, when outputting the ENB signal as an enable signal, the ENB terminal to the high voltage level, and after that, continuously maintains the ENB terminal at the high voltage level until an overcurrent in the USB-IC 55B is detected. Next, whether or not the ENB voltage to be inputted to the OCP terminal represents the high voltage level (whether or not the ENB voltage is higher than the predetermined threshold ENBref) is determined (Step S140), and whether or not there is an overcurrent is monitored. Note that, similar to the first embodiment described above, the predetermined threshold ENBref is set to be 0.8 V as a voltage with which determination of whether or not there is an overcurrent can be reliably performed. If the voltage to be inputted to the OCP terminal represents the high voltage level, it is determined that an overcurrent has not occurred, and monitoring of Step S140 is repeated.

As described above, according to the second embodiment, the USB-IC 55B is configured to invert the voltage level of a member that transmits a defect notification signal, i.e., the defect notification line 77 (the defect notification terminal), and accordingly, the voltage level of the ENB voltage at a point on the ENB line 72B located closer to the USB-IC 55B than the resistor R3 is also inverted (to the low level). Therefore, it is determined that the ENB voltage inputted to the OCP terminal via the monitor line 76B does not represent the high voltage level in Step S140. Thus, it is determined that an overcurrent has occurred, processing to be used at the time of the occurrence of an overcurrent is executed (Step S150), and then, this routine is terminated. As described above, in the second embodiment, although the connector 70B includes the defect notification line 77 indicating that an overcurrent has occurred from the USB-IC 55B, the defect notification line 77 is arranged on the substrate on which the USB-IC 55B is arranged and does not extend to the CPU 62 (SOC 21). Thus, similar to the first embodiment, even when a signal line used specifically for transmitting a signal indicating that an overcurrent has occurred from the USB-IC 55B to the CPU 62 is not provided between the substrates, the CPU 62 may detect the occurrence of an overcurrent by monitoring the voltage of the ENB line 72. As a result, the same advantages as those of the first embodiment are achieved.

The correspondence relationship between constituent elements of the second embodiment and constituent elements of aspects of the present disclosure will be hereinafter clarified. The CPU 62 of the main controller 60 according to the second embodiment corresponds to "the main control unit," the USB-IC 55B corresponds to "the sub-control unit," and the connector 70B corresponds to "the connection circuit." Also, the ENB line 72B corresponds to "the predetermined signal line," the defect notification line 77 corresponds to "the third line," and the monitor line 76B corresponds to "the fourth line."

According to the second embodiment, in the printer 20B described above, the CPU 62 outputs the high level ENB signal to the USB-IC 55B via the ENB line 72B provided with the resistor R3 and detects an overcurrent in the USB-IC 55B on the basis of whether or not the voltage level at a point located closer to the USB-IC 55B than the resistor R3 is the level of the ENB signal or an inverse of the level of the enable signal while the CPU 62 outputs the ENB signal. Also, the USB-IC 55B outputs, when the ENB signal is inputted to the USB-IC 55B from the CPU 62, the 5 V voltage to the VBUS line, and inverts, when an overcurrent occurs in the USB port 55a, the voltage level of the ENB line 72B from the high voltage level of the ENB signal. Thus, the ENB line 72B may be shared for outputting the ENB signal from the CPU 62 and for providing notification of an overcurrent from the USB-IC 55. As a result, the number of lines used for connection between the CPU 62 and the USB-IC 55B may be reduced.

The connector 70B includes the defect notification line 77 connected to the ENB line 72B at the connection point C located closer to the USB-IC 55B than the resistor R3 and the monitor line 76B connected to the ENB line 72B at the connection point D located closer to the CPU 62 than the connection point C and closer to the USB-IC 55B than the resistor R3. The USB-IC 55B inverts, when an overcurrent occurs, the voltage level of the ENB line 72B from the level of the ENB signal by inverting the voltage level of the defect notification line 77, and the CPU 62 detects the overcurrent on the basis of whether the voltage level of the monitor line 76B is the level of the ENB signal or the inverse of the level of the ENB signal. Thus, the configuration and processing of the connector 70B for sharing the ENB line 72B may be simplified. Furthermore, the CPU 62 and the USB-IC 55B are separately arranged on different substrates, and advantageously, the number of lines may be further reduced.

Note that the present disclosure is no way limited to the above-described embodiments and it is needless to say that the present disclosure may be implemented in various embodiments without departing from the technical scope of the present invention.

In the first embodiment described above, the pull-up line 74 is connected to the VBUS line, is grounded via the resistors R1 and R2, and is connected to the ENB line 72 at the connection point A of the resistors R1 and R2. However, the configuration of the pull-up line 74 is not limited thereto, and the pull-up line 74 may have any configuration, as long as the voltage level of the ENB signal is caused to be the voltage level of the ENB signal using the voltage of the VBUS line. For example, if the voltage of the VBUS line and the voltage of the ENB signal are substantially the same, division of voltage using the resistors R1 and R2 is not necessary. Thus, the resistor R2 may be omitted to separate the connection point A from the ground, and only the resistor R1 may be provided. Furthermore, if voltage fluctuation of the USB port 55a (the VBUS line) is small and thus has only small influence on the USB-IC 55, the resistor R1 may be omitted.

In the first embodiment described above, the CPU 62 is configured to determine, when the ENB terminal continues to be in a high voltage level state for the predetermined time α, that output of the ENB signal is completed, put the ENB terminal into a high-impedance state, and start monitoring the voltage level to be inputted to the OCP terminal. However, the configuration of the CPU 62 is not limited thereto, but the CPU 62 may be configured to change the ENB terminal to the high voltage level to put the ENB terminal into a high-impedance state immediately. In this case, in order to prevent error detection, it is preferable that detection of an overcurrent is not performed for a predetermined time since the ENB terminal is put into a high-impedance state, but detection of an overcurrent is performed after the predetermined time has lapsed.

In the second embodiment described above, the ENB signal is a high level signal. However, the ENB signal is not limited thereto, but may be a low level signal. In this case, in the USB-IC 55B, the defect notification terminal may be configured to be capable of inverting a low level signal to a high level signal and invert, when an overcurrent occurs, the voltage level of the defect notification line 77 (the defect notification terminal) to the high voltage level.

In the second embodiment described above, the USB-IC 55B is configured to invert, when an overcurrent occurs, the voltage level of the ENB line 72B from the level of the ENB signal by inverting the voltage level of the defect notification line 77 (the defect notification terminal). However, the configuration of the USB-IC 55B is not limited thereto, but the USB-IC 55B may be configured to invert, when an overcurrent occurs, the voltage level of the ENB line 72B using any method, as long as the method allows inversion of the voltage level of the ENB line 72. Also, the CPU 62 is configured to detect an overcurrent on the basis of whether the voltage level of the monitor line 76B is the level of the ENB signal or the inverse of the level of the ENB signal. However, the configuration of the CPU 62 is not limited thereto, but the CPU 62 may detect an overcurrent using any method, as long as the CPU 62 detects an overcurrent on the basis of whether the voltage level at a point on the ENB line 72B located closer to the USB-IC 55B than the resistor R3 is the level of the ENB signal or the inverse of the level of the ENB signal.

In the above-described embodiments, a defect of an overcurrent is detected. However, aspects of the present disclosure are not limited thereto, but a defect related to power supply in the USB-IC 55 such as a defect that power supply of the VBUS line becomes unstable and the like may be detected.

In the above-described embodiments, each of the USB-IC 55 and the USB-IC 55B is arranged on a different substrate from a substrate on which the CPU 62 is arranged. However, the arrangements of the CPU 62, the USB-IC 55, and the USB-IC 55B is not limited thereto, but each of the USB-IC 55 and the USB-IC 55B may be arranged on a substrate on which the CPU 62 is arranged.

In the above-described embodiments, the USB-IC 55 and the USB-IC 55B have been described as examples of the sub-control unit. However, the sub-control unit is not limited thereto, but may be any control unit such as, for example, a control unit that turns on and off the power source line for supplying power to an external device, as long as the sub-control unit is a control unit that controls the external device.

In the above-described embodiments, the printer 20 is described as an example electronic device according to the present disclosure. However, the electronic device is not limited thereto, but an aspect of the present disclosure may be applied to any electronic device such as a personal computer, a television (TV) set, an optical disk recording reproduction device such as a BD and DVD recorder, and the like, a music player, and a car navigation system, etc., as long as the electronic device includes a main control unit and a sub-control unit that is connected to the main control unit and performs control of the external device.

What is claimed is:
1. An electronic device comprising:
a main control unit; and
a sub-control unit that is connected to the main control unit via a connection circuit including a predetermined signal line and that performs control of an external device,
wherein the main control unit outputs as an enable signal that enables driving of the sub-control unit a signal which represents a high voltage level to the sub-control unit via the predetermined signal line and detects, after output of the enable signal is completed, a defect in the sub-control unit on the basis of whether or not a voltage level of the predetermined signal line is the high voltage level,
the sub-control unit outputs, when the enable signal is inputted thereto from the main control unit, a predetermined voltage to a power line that is capable of supplying power to the external device and stops, when a defect related to power supply occurs, output of the predetermined voltage to the power line,
the connection circuit is configured so that, when the predetermined voltage is outputted to the power line, the voltage level of the predetermined signal line is changed to the high voltage level by the predetermined voltage and, when output of the predetermined voltage to the power line is stopped, the voltage level of the predetermined signal line is changed to a low voltage level,
wherein the connection circuit is connected to the power line and is grounded via a first resistor and a second resistor, and further includes a first line connected to the predetermined signal line at a point between the first resistor and the second resistor,
wherein the connection circuit further includes a second line connected to the predetermined signal line at a point closer to the main control unit than a connection point of the predetermined signal line and the first line, and
the main control unit includes
an enable signal terminal connected to the predetermined signal line, and
a monitor terminal connected to the second line, and
the main control unit is configured to change, when the enable signal is outputted, a voltage level of the enable signal terminal to the high voltage level, determine, when the enable signal has continued to be in a high voltage level state for a predetermined time, that output of the enable signal is completed, put the enable signal terminal into a high-impedance state, start monitoring the voltage level that is to be inputted to the monitor terminal, and thereby detect a defect in the sub-control unit.

2. The electronic device according to claim 1,
wherein the main control unit and the sub-control unit are separately arranged in different substrates.

3. An electronic device comprising:
a main control unit; and
a sub-control unit that is connected to the main control unit via a predetermined signal line provided with a resistor and performs control of an external device,
wherein the main control unit outputs as an enable signal that enables driving of the sub-control unit a signal which represents a high voltage level or a low voltage level to the sub-control unit via the predetermined signal line and detects a defect in the sub-control unit on the basis of whether or not the voltage level at a point on the predetermined signal line which is located closer to the sub-control unit than the resistor is the level of the enable signal or an inverse of the level of the enable signal while the main control unit outputs the signal, and
the sub-control unit outputs, when the enable signal is inputted thereto from the main control unit, a predetermined voltage to a power line that is capable of supplying power to the external device and inverts, when a defect related to power supply occurs, the voltage level at the point on the predetermined signal line which is located closer to the sub-control unit than the resistor from the level of the enable signal.

4. The electronic device according to claim 3, further comprising:
a connection circuit including
the predetermined signal line,
a third line connected to the predetermined signal line at a point located closer to the sub-control unit than the resistor, and
a forth line connected to the predetermined signal line at a point located closer to the sub-control unit than the resistor and closer to the main control unit than a connection point of the third line, wherein the sub-control unit is connected to the third line, in addition to the predetermined signal line, and is configured to invert, when a defect occurs, the voltage level of the predetermined signal line from the level of the enable signal by inverting the voltage level of the third line, and the main control unit is connected to the fourth line, in addition to the predetermined signal line, and is configured to detect a defect in the sub-control unit on the basis of whether or not the voltage level of the fourth line is the level of the enable signal or the inverse of the level of the enable signal.

* * * * *